United States Patent
Guo et al.

(10) Patent No.: US 8,624,681 B2
(45) Date of Patent: Jan. 7, 2014

(54) LOW NOISE CMOS RING OSCILLATOR

(75) Inventors: Zhendong Guo, San Jose, CA (US); Jun Ming, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 16 days.

(21) Appl. No.: 13/212,771

(22) Filed: Aug. 18, 2011

(65) Prior Publication Data

US 2012/0049964 A1 Mar. 1, 2012

Related U.S. Application Data

(60) Provisional application No. 61/376,391, filed on Aug. 24, 2010.

(51) Int. Cl.
*H03K 3/03* (2006.01)

(52) U.S. Cl.
USPC ............................................................ 331/57

(58) Field of Classification Search
CPC ........................... H03K 3/0315; H03K 3/0322
USPC .......................................................... 331/57
See application file for complete search history.

(56) References Cited

U.S. PATENT DOCUMENTS

| | | | | |
|---|---|---|---|---|
| 4,358,728 A | * | 11/1982 | Hashimoto | 323/275 |
| 6,650,191 B2 | * | 11/2003 | Branch et al. | 331/57 |
| 7,679,463 B2 | | 3/2010 | Pernia et al. | |
| 2001/0002115 A1 | | 5/2001 | Hwang et al. | |
| 2006/0238261 A1 | | 10/2006 | Rhee et al. | |
| 2008/0111639 A1 | * | 5/2008 | Ryckaert et al. | 331/57 |
| 2008/0284529 A1 | | 11/2008 | Refeld et al. | |
| 2009/0167446 A1 | * | 7/2009 | Higashi | 331/57 |

OTHER PUBLICATIONS

PCT International Search Report, Application No. PCT/US11/48277, Dec. 19, 2011.

* cited by examiner

*Primary Examiner* — Ryan Johnson (57) ABSTRACT

Disclosed is an inverter cell design comprising first and second transistors and first and second resistors. In disclosed embodiments, the first resistor is connected to a source of the first transistor and the second resistor is connected to a source of the second transistor. The first and second resistors are configured for connection to respective first and second voltage potentials. The inverter cells may be configured in a ring oscillator. A crystal oscillator may comprise an inverter cell according to the present disclosure.

9 Claims, 8 Drawing Sheets

LOW NOISE CMOS RING OSCILLATOR

CROSS REFERENCE TO RELATED APPLICATIONS

The present disclosure claims priority to U.S. Provisional App. No. 61/376,391 filed on Aug. 24, 2010, the content of which is incorporated herein by reference in its entirety for all purposes.

BACKGROUND

The present invention relates to oscillator circuits and in particular to a low noise CMOS ring oscillator.

Unless otherwise indicated herein, the approaches described in this section are not prior art to the claims in this application and are not admitted to be prior art by inclusion in this section.

Complimentary Metal Oxide Semiconductor (CMOS) ring oscillators are widely used in Phase Locked Loop (PLL) circuits. PLLs are commonly used for clock and data recovery, frequency synthesis, clock generation circuitry, etc. Among the various types of CMOS ring oscillators, inverter based single ended or differential ring oscillators are recognized as being efficient and are often the ring oscillator design of choice.

Figure 1:
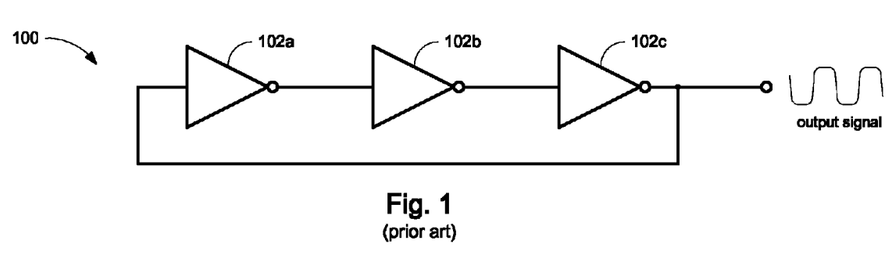
FIG. 1 illustrates a ring oscillator.

FIG. 1 shows a schematic diagram for a three-stage inverter-based ring oscillator 100. The ring oscillator 100 comprises a chain of three inverters 102a, 102b, and 102c connected in cascade fashion. The output of last inverter 102c feeds back into the input of the first inverter 102a. Inverter-based ring oscillators can be constructed with any odd number of inverters.

Figure 1A:
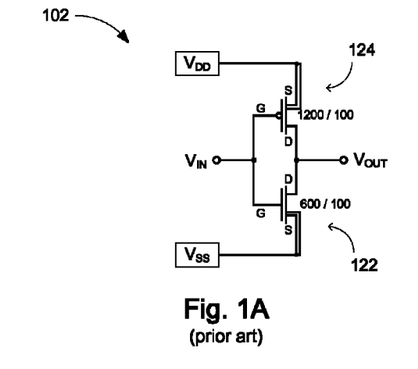
FIG. 1A shows details for an inverter cell.

FIG. 1A is a circuit diagram of a typical inverter cell 102 that may be used for inverters 102a, 102b, and 102c in the ring oscillator 100 shown in FIG. 1. The inverter cell 102 comprises a first transistor 122 and a second transistor 124. The transistors 122 and 124 may be Field Effect Transistors (FETs). A gate G of each transistor 122 and 124 is connected to an input terminal $V_{in}$ of the inverter cell 112. A drain D of each transistor 122 and 124 is connected to an output terminal $V_{OUT}$ of the inverter cell 102. A source S of transistor 122 is configured for connection to a first voltage potential; e.g., $V_{SS}$. A source S of transistor 124 is configured for connection to a second voltage potential; e.g., $V_{DD}$.

As semiconductor manufacturing processes continue to shrink and the requirements for higher switching speeds continue to increase, inverter-based ring oscillators are designed with increasingly smaller device sizes in order to maintain reasonable levels of power consumption. As device dimensions decrease, device noise in ring oscillators become significant. One kind of noise called "flicker noise," which occurs in most electronic devices, is dominant at low frequencies. For inverter-based ring oscillator devices using deep submicron processes like 45 nm processes or 30 nm processes, flicker noise can predominate at frequencies as high as about 10 MHz-20 MHz. For frequencies above a corner frequency of 10 MHz to 20 MHz, "thermal noise" tends to predominate. For circuit applications that run at 1 MHz to 10 MHz, the flicker noise is the predominant noise source, and can manifest itself in the output signal of the ring oscillator as phase noise (frequency domain) or jitter (time domain).

SUMMARY

In accordance with disclosed embodiments, a ring oscillator includes a number of inverter cells connected in cascade fashion. An output of each inverter cell is connected to an input of another inverter cell. Each inverter cell includes first and second resistors for connection to respective first and second voltage potentials. An output of the ring oscillator is an oscillatory signal having a frequency that is based at least on the resistance values of the first and second resistors.

In some embodiments, each inverter cell includes first and second transistors. Sources of the first and second transistors are connected to the first and second resistors, respectively.

In some embodiments, each inverter cell further includes a capacitor connected to the first and second transistors.

In an embodiment, a phase locked loop comprises a ring oscillator in accordance with the present disclosure. In another embodiment, a frequency divider circuit comprises a ring oscillator in accordance with the present disclosure.

The following detailed description and accompanying drawings provide a better understanding of the nature and advantages of the present invention.

DETAILED DESCRIPTION

In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 2:
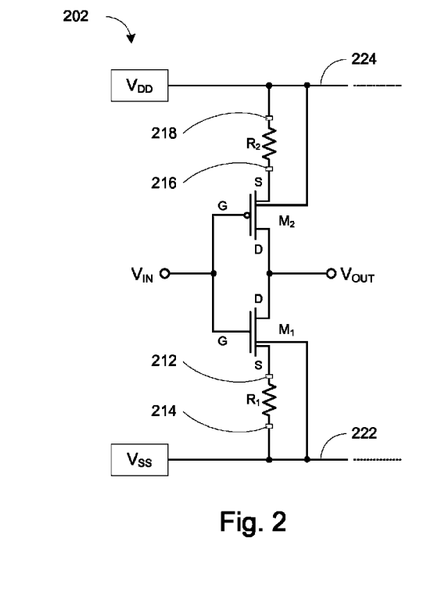
FIGS. 2 and 2A shows details for inverter cells in accordance with the present disclosure.

Referring to FIG. 2, an inverter cell 202 in accordance with embodiments of the present disclosure comprises a first transistor $M_1$ and a second transistor $M_2$, and a first resistor $R_1$ and a second resistor $R_2$. The transistors $M_1$ and $M_2$ may be FETs; e.g., Metal Oxide Semiconductor FETs (MOSFETs). In an embodiment, the transistor $M_1$ is an N-channel MOSFET and the transistor $M_2$ is a P-channel MOSFET. It will be appreciated of course that other combinations of transistor types for $M_1$ and $M_2$ may be employed.

An input terminal $V_{in}$ of the inverter cell 202 is connected to a gate G of each transistor $M_1$ and $M_2$. An output terminal $V_{OUT}$ of the inverter cell 202 is connected to a drain D of each transistor $M_1$ and $M_2$. A source S of transistor $M_1$ is connected to a first terminal 212 of resistor $R_1$. A second terminal 214 of resistor $R_1$ may be connected to a first power rail 222 that is configured for connection to a first voltage potential; e.g., $V_{SS}$. A source S of transistor $M_2$ is connected to a first terminal 216 of resistor $R_2$. A second terminal 218 of resistor $R_2$ may be connected to a second power rail 224 that is configured for connection to a second voltage potential; e.g., $V_{DD}$.

Figure 3:
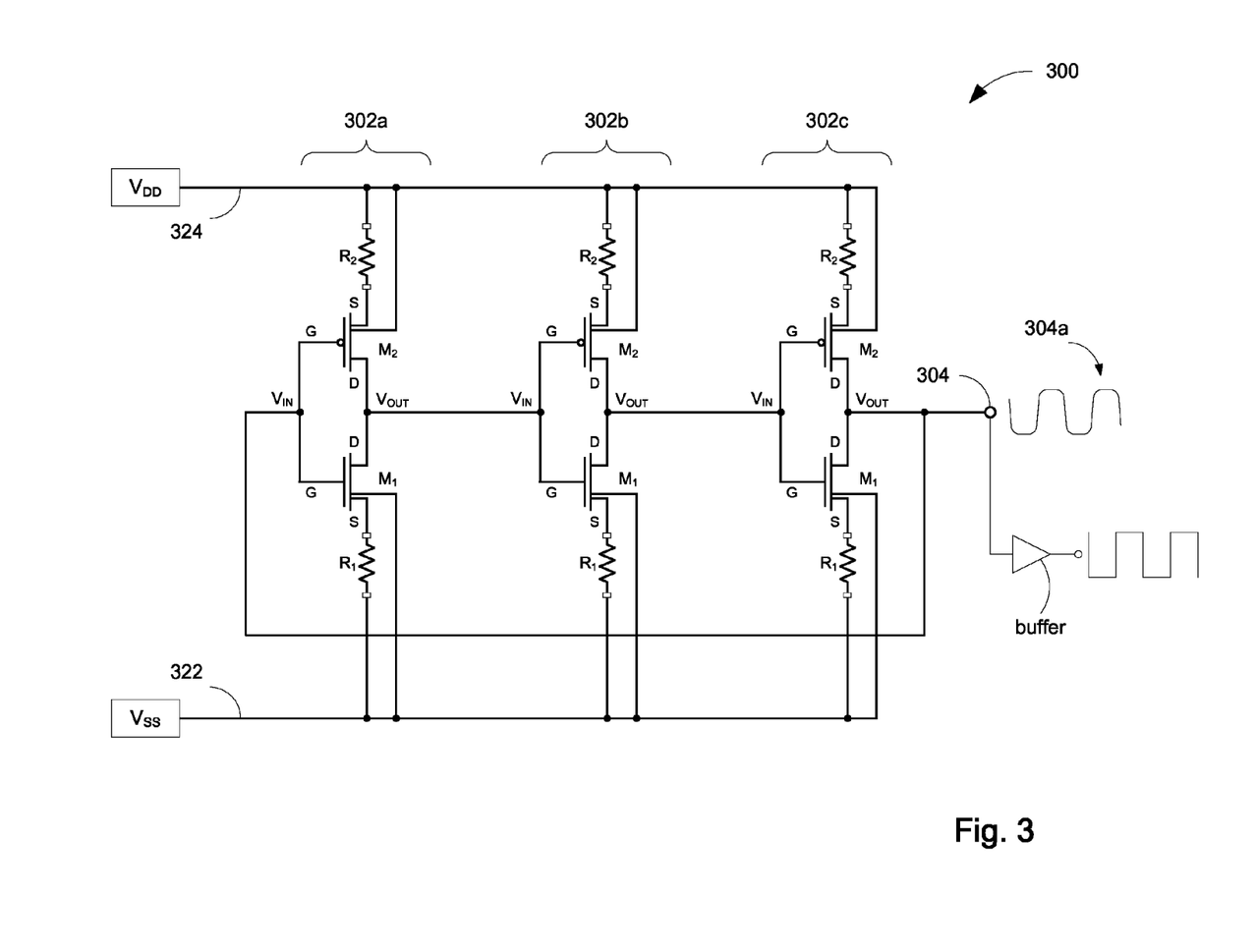
FIGS. 3, 3A, and 3B illustrate embodiments of ring oscillators in accordance with the principles of the present invention.
Figure 3A:
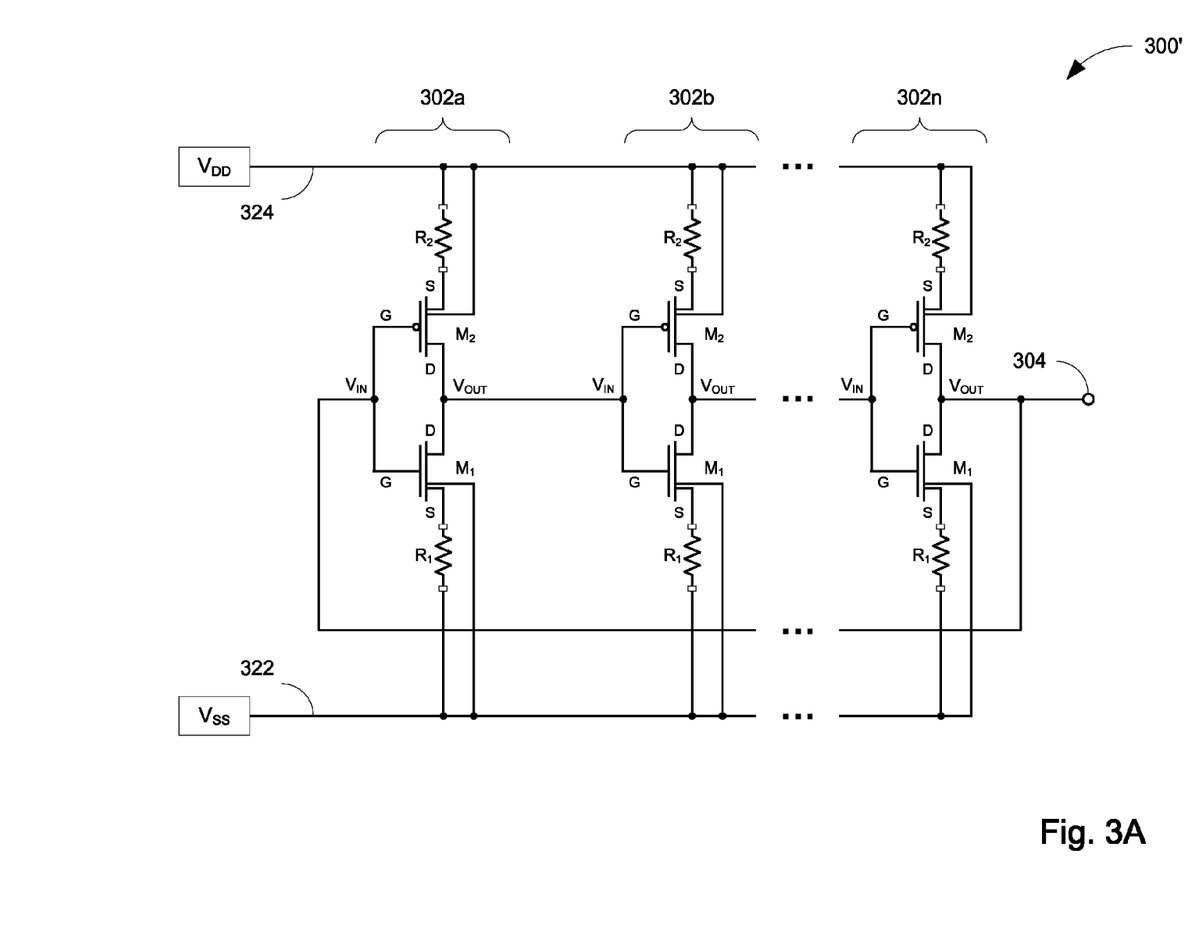

FIG. 3 illustrates an embodiment of a ring oscillator 300 comprising inverter cells 302a, 302b, and 302c of the form shown in FIG. 2. In some embodiments, the inverter cells 302a, 302b, and 302c are connected in cascade fashion. Accordingly, the output $V_{OUT}$ of cell 302a is fed into the input $V_{in}$ of cell 302b. The output $V_{OUT}$ of cell 302b is fed into the input $V_{in}$ of cell 302c. The output $V_{OUT}$ of cell 302c is fed back into the input $V_{in}$ of cell 302a. The resistors $R_1$ and $R_2$ of each cell 302a, 302b, and 302c may be connected to respective power rails 322 and 324 to provide power to the ring oscillator 300. The power rails 322 and 324, in turn, may be at respective first and second voltage potentials (e.g., $V_{SS}$ and $V_{DD}$). In some embodiments, the ring oscillator 300 may include additional cells. For example, FIG. 3A illustrates a more generic ring oscillator design 300' comprising some number of stages 302a through 302n other than the three stages shown in FIG. 3. The number of stages 302a through 302n may be an even number or an odd number.

The ring oscillator 300 shown in FIG. 3 may output an oscillatory signal 304a at a terminal 304. The resistors $R_1$ and $R_2$ can attenuate the level of flicker noise (phase noise) in the output signal 304a as a result of the effect of resistor degeneration. Though the output signal 304a is oscillatory, its shape may not be adequate for use by electronic circuits that the ring oscillator 300 is being used in. For example, the output signal 304a may not be a properly formed square (or rectangular) wave or a properly formed sinusoidal wave. Accordingly, additional circuitry may be used to produce a suitable waveform. For instance, the output signal 304a may be further processed by a buffer that can output a properly formed square wave based on the received output signal.

Referring back to FIGS. 1 and 1A, the frequency of the output signal of the ring oscillator 100 is dependent upon various aspects of the design of the ring oscillator. For example, the number of inverter stages that comprise the ring oscillator 100 affects the frequency. The frequency will decrease as the number of inverter stages increase, because each additional inverter adds to the propagation delay of the signal along the chain of inverters and hence how frequently the output signal will switch between HI and LO logic levels.

The transconductance ($g_m$) of the inverters that comprise a ring oscillator 100 is another factor that affects the frequency of the output signal of the ring oscillator. The transconductance of a CMOS inverter is a function of the device size of its constituent transistors. Referring to the inverter cell 102 shown in FIG. 1A, for example, the device size of FET transistor 124 is typically specified by its channel dimensions, which may be expressed as the ratio W/L, where W is the FET channel width (W) and L is the FET channel length. FIG. 1A shows typical channel dimensions for the FET transistors 122 and 124 of the inverter 102. For example, transistor 122 may have a channel dimension of 600/100 and transistor 124 may have a channel dimension of 1200/100. The transconductance also affects power consumption in each inverter during operation, and hence power consumption of the ring oscillator 100 as a whole.

Referring now to FIGS. 2 and 3, in accordance with embodiments of the present disclosure, the transconductance of the inverter 202 shown in FIG. 2 is dependent not only on the channel dimensions of FET transistors $M_1$ and $M_2$, but also on the sizes of the resistors $R_1$ and $R_2$. Suppose the inverters 302a, 302b, and 302c comprising ring oscillator 300 are designed to have substantially the same transconductance as the design of inverter 102 shown in FIG. 1A. For example, the transconductance of the particular inverter design shown in FIG. 2 is substantially the same as the transconductance as the design of inverter 102 shown in FIG. 1A, where the channel dimension of FET transistor $M_1$ is 1200/50, the channel dimension of FET transistor $M_2$ is 2400/50, and each resistor $R_1$ and $R_2$ is 600Ω. In other embodiments, the resistors $R_1$ and $R_2$ may have different resistance values. Suppose the inverters 302a, 302b, and 302c use the inverter design of FIG. 2. Since the ring oscillator 300 is also a three-stage device as is ring oscillator 100, then the output frequency and power consumption performance of both ring oscillators 100 and 300 are about the same. However, the ring oscillator 300 will exhibit attenuated flicker noise, and in particular reduced phase noise.

Simulations of a three-stage ring oscillator designed using the inverter cell 102 of FIG. 1A and a three-stage ring oscillator designed using the inverter cell 202 of FIG. 2 were compared. Both ring oscillators were designed to produce an output signal in the gigahertz range. The simulations have shown that the ring oscillator based on the inverter cell 202 exhibits a 2.5 dB reduction in phase noise at 10 MHz as compared to the ring oscillator based on the inverter cell 102. Simulations were made using ring oscillators designed for 3-5 GHz output signals with even greater improvement; a 6 dB difference in phase noise was noted.

In some embodiments, the resistor degeneration effect in the ring oscillator 300 can be increased to further attenuate phase noise by increasing the sizes of the resistors $R_1$ and $R_2$ in the ring oscillator. However, the frequency of the output signal 304a is inversely related to the resistance of the resistors $R_1$ and $R_2$. Therefore, increasing the resistance of resistors $R_1$ and $R_2$ in an attempt to further attenuate phase noise will also decrease the frequency of the output signal 304a.

Figure 2A:
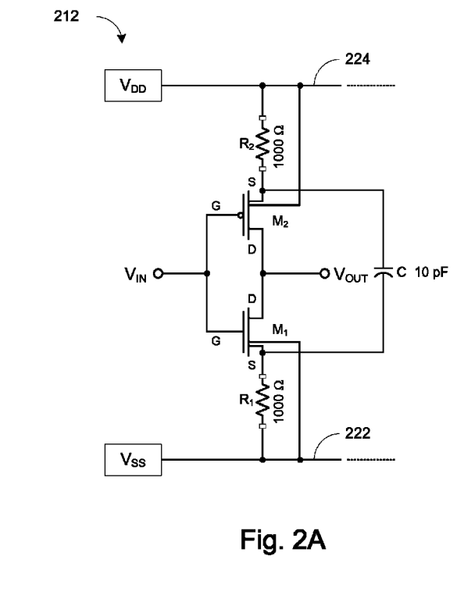

FIG. 2A shows an embodiment of an inverter cell 212 that is a variation of the inverter cell 202 shown in FIG. 2, wherein each resistor $R_1$ and $R_2$ is designed for 1 KΩ to provide additional phase noise attenuation. The inverter cell 212 includes a capacitor C to compensate for the reduction in the frequency of the output signal 304a that may result from using bigger resistors $R_1$ and $R_2$. In the particular embodiment shown in FIG. 2A, the capacitor C has a capacitance of 10 pF.

Figure 3B:
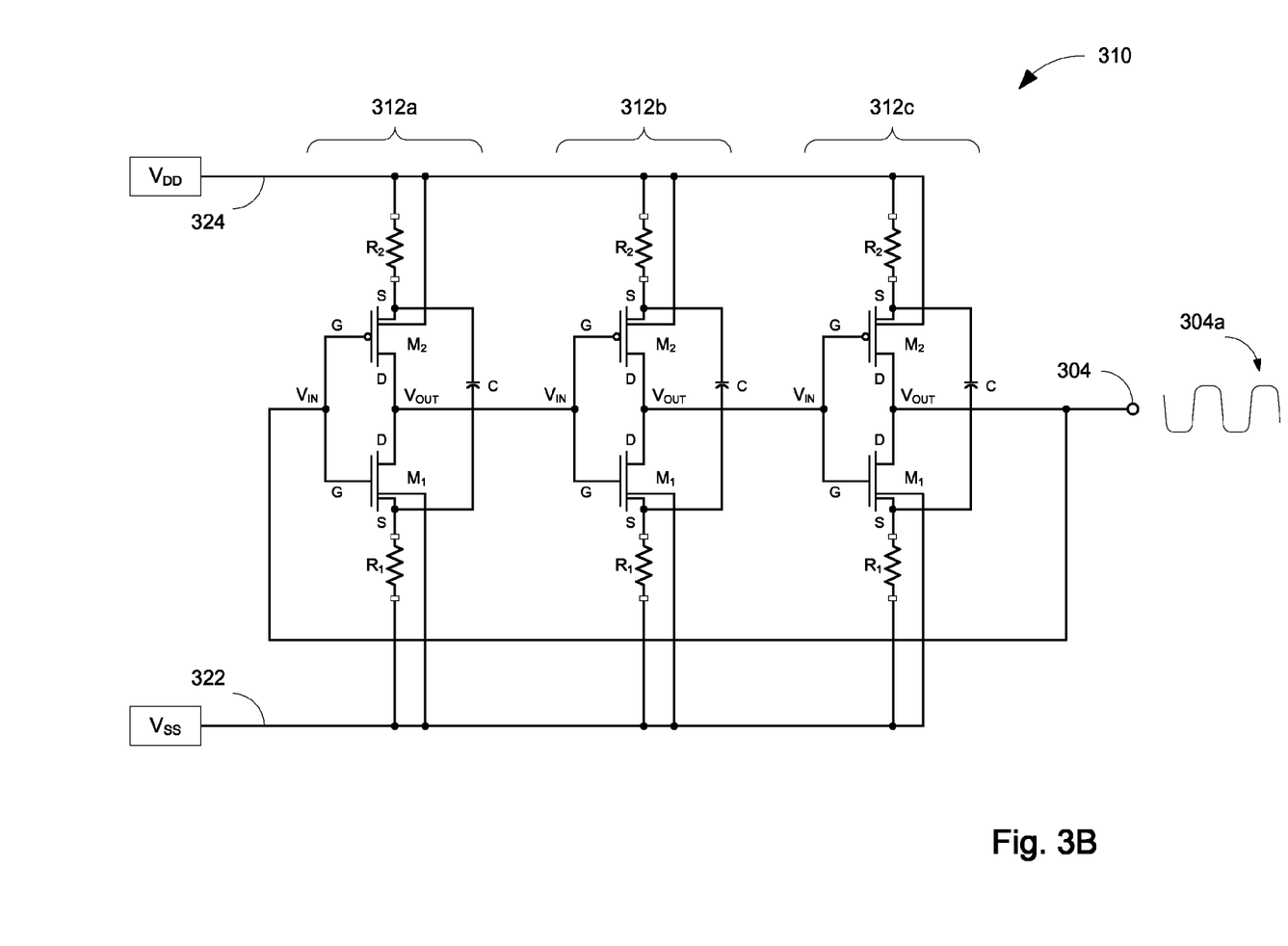

FIG. 3B shows an embodiment of a ring oscillator 310 comprising inverter cells 312a, 312b, and 312c of the form shown in FIG. 2A. The cells 312a, 312b, and 312c are connected in cascade fashion; for example, the output $V_{OUT}$ of cell 312a is fed into the input $V_{in}$ of cell 312b. The output $V_{OUT}$ of cell 312b is fed into the input $V_{in}$ of cell 312c. The output $V_{OUT}$ of cell 312c is fed back into the input $V_{in}$ of cell 312a. In some embodiments, the ring oscillator 310 may include additional cells. Simulations of this embodiment of the ring oscillator have shown an additional 1 dB improvement in the reducing phase noise.

In other embodiments, the inverter cell 202 of FIG. 2 may be used in a crystal oscillator design. The inverter cell 202 itself exhibits improved flicker noise performance because of the effect of resistor degeneration provided by resistors $R_1$ and $R_2$. Accordingly, a crystal-based oscillator design that employs the inverter cell 202 may likewise exhibit a similar improvement in reduced flicker noise.

Figure 4:
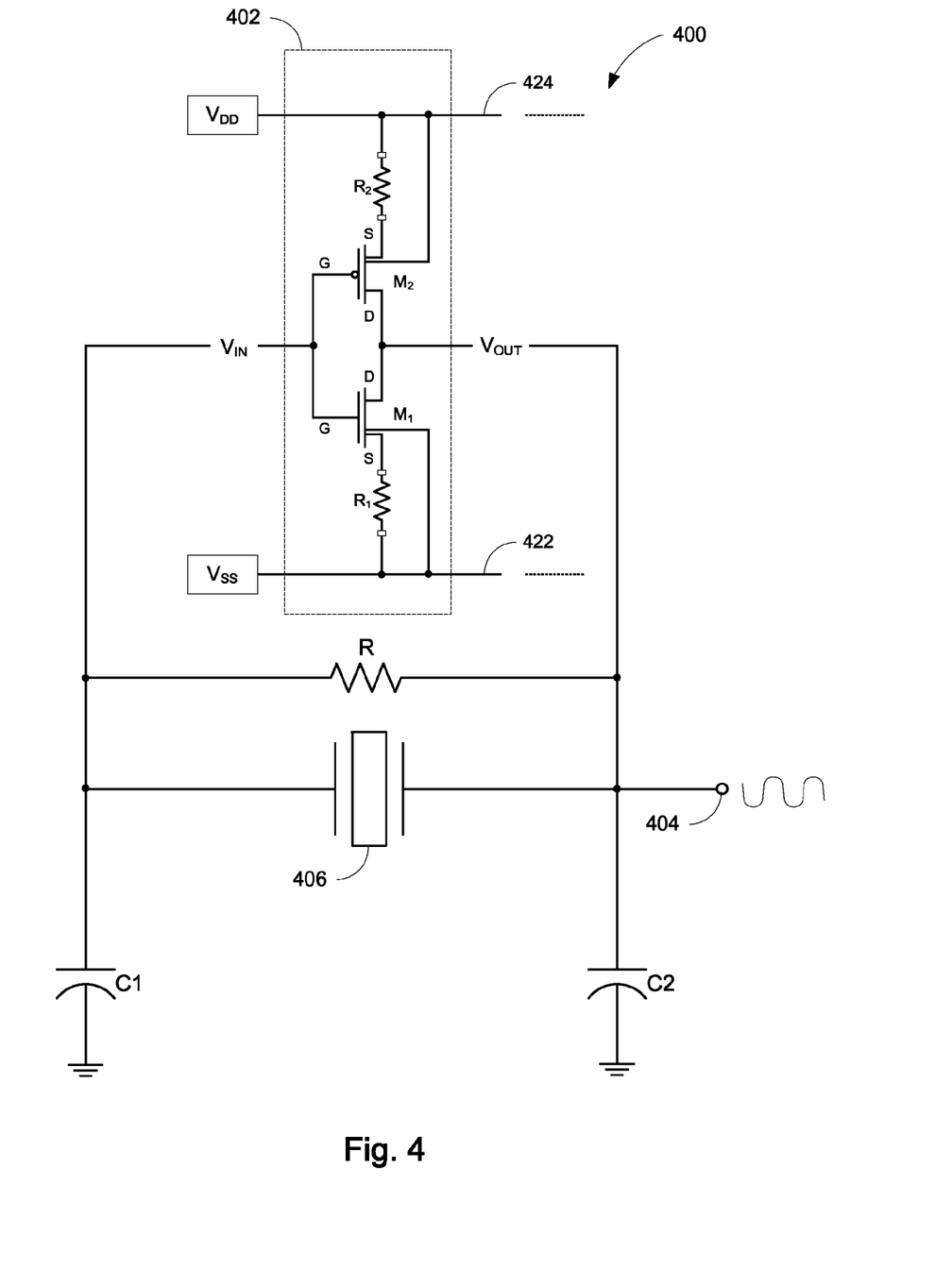
FIGS. 4 and 4A illustrate embodiments of crystal oscillators in accordance with the principles of the present invention.

FIG. 4 illustrates a crystal oscillator 400 in accordance with embodiments of the present disclosure. The oscillator 400 comprises a suitable crystal 406. A pi ($\pi$) network comprising capacitors C1 and C2 may be used to set a resonant frequency in the crystal 406. An inverter 402 of the form illustrated in FIG. 2 is connected in parallel with the crystal. A resistor R is connected in parallel with the inverter 402 and serves to bias the inverter 402 to operate within its linear region. An output terminal 404 of the oscillator 400 may be provided in order to output an oscillatory signal that is generated by the oscillator.

Figure 4A:
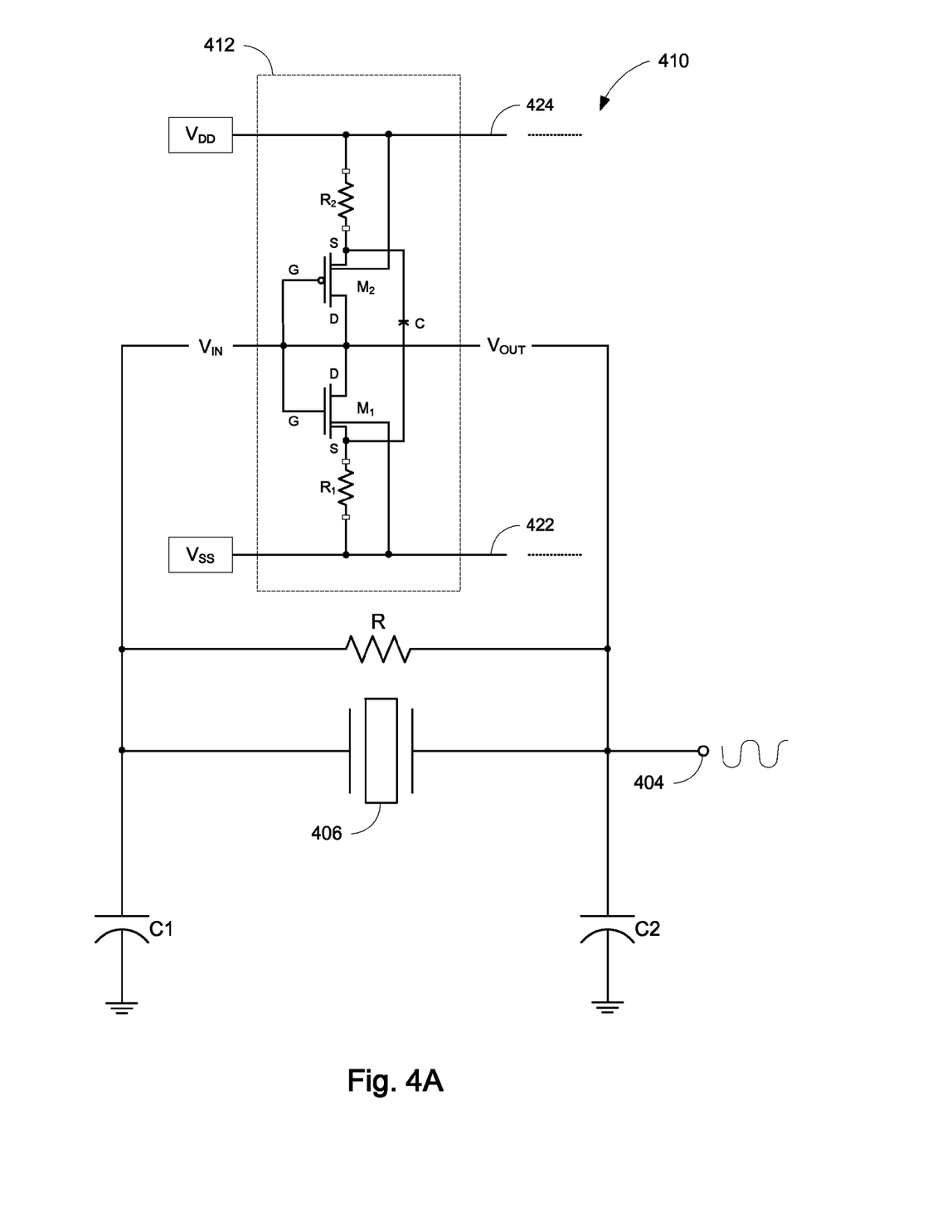

In other embodiments, an oscillator 410 shown in FIG. 4A may include an inverter 412 of the form illustrated in FIG. 2A to attain greater flicker noise attenuation, while maintaining a suitable output frequency.

In some embodiments, the ring oscillator 300 in FIG. 3 may be designed for operation in the gigahertz range. The ring oscillator 300 in FIG. 3 may be used in a PLL designed for operation in the range of 10 MHz±5 MHz. In some embodiments, the ring oscillator 300 in FIG. 3 may be designed for operation at a corner frequency $F_c$ between the region of flicker noise dominance and thermal noise dominance.

Figure 5:
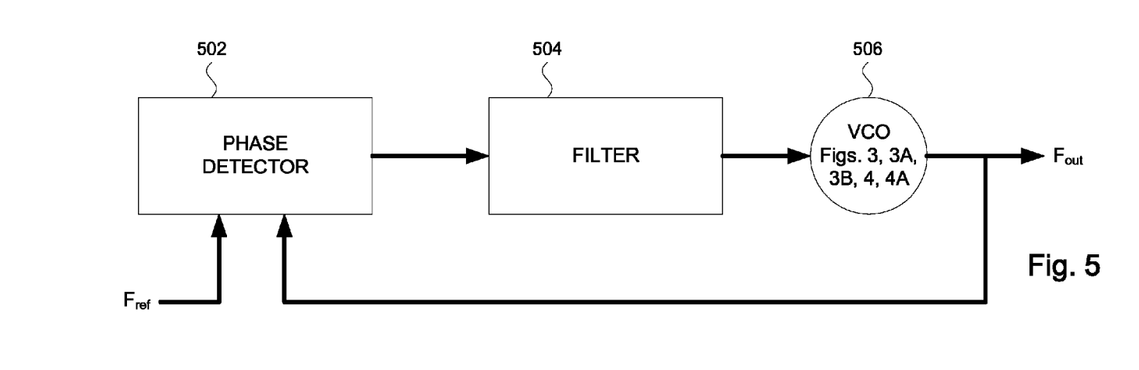
FIG. 5 is a block diagram of a phase locked loop in accordance with the present disclosure.

As illustrated in FIG. 5, disclosed embodiments of a ring oscillator in accordance with principles of the present invention may be embodied in a PLL circuit 500. A phase detector 502 receives two inputs: a reference input $F_{ref}$ and feedback from an output $F_{out}$ of a Voltage Controlled Oscillator (VCO) 506. Circuitry for the phase detector 502 is well known. The VCO 506 comprises an embodiment of a ring oscillator in accordance with principles of the present invention. In some embodiments, the VCO 506 comprises an embodiment of a crystal oscillator in accordance with principles of the present invention. The output of the phase detector 502 is fed to the VCO 506 via filter 504. The output of the phase detector 502 controls the VCO 506 such that the phase difference between the two inputs $F_{ref}$ and $F_{out}$ is held constant. The filter 504 determines the dynamics of the PLL circuit 500, such as how quickly the PLL circuit 500 responds to changes in the output of the VCO 506.

Figure 6:
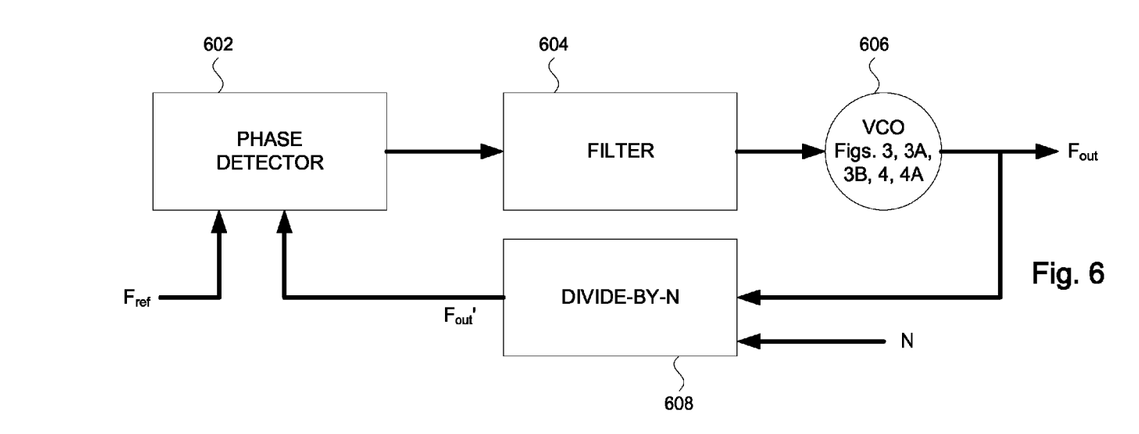
FIG. 6, is a block diagram of a frequency divider circuit in accordance with the present disclosure.

As illustrated in FIG. 6, a ring oscillator in accordance with principles of the present invention may be embodied in a frequency synthesizer circuit 600. A frequency synthesizer may be based on a PLL circuit, for example such as the one depicted in FIG. 5. Accordingly, a phase detector 602 receives two inputs: a reference input $F_{ref}$ and feedback based on an output $F_{out}$ of a VCO 606. The VCO 606 comprises an embodiment of a ring oscillator in accordance with principles of the present invention. In some embodiments, the VCO 606 comprises an embodiment of a crystal oscillator in accordance with principles of the present invention. A programmable divide-by-n network 608 receives two inputs: the output $F_{out}$ from the VCO 606 and a counter N, and outputs a signal $$F'_{out}\left(=\frac{F_{out}}{N}\right)$$

that feeds into the phase detector 602. The output of the phase detector 602 is fed to the VCO 606 via filter 604. The output of the phase detector 602 controls the VCO 606 such that the phase difference between the two inputs $F_{ref}$ and $F_{out}'$ is held constant. The filter 604 determines the dynamics of the PLL circuit 600, such as how quickly the PLL circuit 600 responds to changes in the output of the VCO 606.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A ring oscillator, comprising:
   a plurality of inverters connected in a cascade fashion, wherein an output of each inverter is connected to an input of another inverter; and
   an output terminal configured to output an oscillatory signal having a frequency,
   wherein each of the plurality of inverters comprises:
      a first transistor;
      a first resistor having a first end and a second end, wherein the first end of the first resistor is directly connected to a source of the first transistor, and wherein the second end of the first resistor is directly connected to a first voltage potential;
      a second transistor;
      a second resistor having a first end and a second end, wherein the first end of the second resistor is directly connected to a source of the second transistor, and wherein the second end of the second resistor is directly connected to a second voltage potential, such that the first resistor, the first transistor, the second transistor, and the second resistor form a series connection; and
      a capacitor having a first end and a second end, wherein the first end of the capacitor is directly connected to each of (i) the source of the first transistor and (ii) the first end of the first resistor, and wherein the second end of the capacitor is directly connected to each of (i) the source of the second transistor and (ii) the first end of the second resistor, such that the capacitor is connected in parallel with the first transistor and the second transistor, and is connected in series with the first resistor and the second resistor,
   wherein the frequency of the oscillatory signal is based at least on (i) resistance values of the first resistors and (ii) resistance values of the second resistors.

2. The ring oscillator of claim 1, wherein:
   a gate of the first transistor and a gate of the second transistor are connected to the input of a respective one of the plurality of inverters,
   wherein a drain of the first transistor and a drain of the second transistor are connected to the output of a respective one of the plurality of inverters.

3. The ring oscillator of claim 1, wherein a flicker noise of the ring oscillator is dependent on the resistance values of the first resistors and the resistance values of the second resistors.

4. The ring oscillator of claim 1, wherein the capacitor increases an operating frequency of the ring oscillator.

5. The ring oscillator of claim 1, wherein the plurality of inverters include a first inverter and a last inverter, and wherein an output of the last inverter is connected to an input of the first inverter.

6. The ring oscillator of claim 1, wherein the first voltage potential is different from the second voltage potential.

7. The ring oscillator of claim 1, wherein the first resistors are connected to the first voltage potential, and wherein the second resistors are connected to the second voltage potential.

8. A phase locked loop comprising the ring oscillator of claim 1.

9. A method for operating a ring oscillator, the method comprising:

generating a first output from a first inverter circuit;
feeding the first output into a second inverter circuit to generate a second output;
feeding the second output into at least a third inverter circuit to generate a third output;
feeding the third output into the first inverter circuit, thereby generating the first output;
reducing flicker noise in the ring oscillator by producing a resistor degeneration effect in the first inverter, the second inverter, and the third inverter,
wherein producing the resistor degeneration effect in an inverter includes
   providing a first voltage level to a first transistor of the inverter via a first resistor, the first resistor having (i) a first end directly connected to a source of the first transistor and (ii) a second end directly connected to a first supply corresponding to the first voltage level, and
   providing a second voltage level to a second transistor of the inverter via a second resistor, the second resistor having (i) a first end directly connected to a source of a second transistor and (ii) a second end directly connected to a second supply corresponding to the second voltage level, such that the first resistor, the first transistor, the second transistor, and the second resistor form a series connection; and
using a capacitor connected between the first resistor and the second resistor, increasing an operating frequency of the ring oscillator, wherein the capacitor is connected in parallel with the first transistor and the second transistor, and is connected in series with the first resistor and the second resistor.

\* \* \* \* \*